United States Patent [19]

Wong et al.

[11] Patent Number: 4,584,695
[45] Date of Patent: Apr. 22, 1986

[54] DIGITAL PLL DECODER

[75] Inventors: Hee Wong; Ramanatha V. Balakrishnan, both of San Jose; Herb O. Schneider, Santa Clara, all of Calif.

[73] Assignee: National Semiconductor Corporation, Santa Clara, Calif.

[21] Appl. No.: 550,526

[22] Filed: Nov. 9, 1983

[51] Int. Cl.$^4$ .............................................. H03D 3/18
[52] U.S. Cl. ........................................ 375/81; 328/63; 328/72; 329/122
[58] Field of Search ................... 375/80, 81, 82, 119; 370/100; 328/72, 74, 133, 63; 455/260; 329/122; 307/523, 524

[56] References Cited

U.S. PATENT DOCUMENTS

| | | | |
|---|---|---|---|
| 3,956,623 | 5/1976 | Clark et al. ........................ | 375/82 |
| 4,280,099 | 7/1981 | Rattlingourd ...................... | 375/119 |
| 4,302,845 | 11/1981 | McClaughry et al. ............ | 375/82 |
| 4,330,863 | 5/1982 | Wright ................................ | 375/81 |
| 4,380,081 | 4/1983 | Di Tria .............................. | 375/82 |
| 4,400,817 | 8/1983 | Sumner .............................. | 375/119 |
| 4,414,676 | 11/1983 | Kraul et al. ...................... | 375/119 |

*Primary Examiner*—Robert L. Griffin
*Assistant Examiner*—Stephen Chin
*Attorney, Agent, or Firm*—Paul J. Winters; Michael J. Pollock; Gail Woodward

[57] ABSTRACT

A digital PLL technique to provide an effective sampling interval and resolution shorter than the driver clock period. A multi-phase driver clock provides a clock signals phase-offset from each other. One clock output signal is used as the driver clock to clock an input sampler. A pattern of bit samples before, nominally at, and after a predicted clock edge indicates whether a leading or lagging phase should be substituted for the present driver clock signal. The phase difference is substantially less than the period of the fastest clock presently available to generate satisfactory shaped pulses.

14 Claims, 6 Drawing Figures

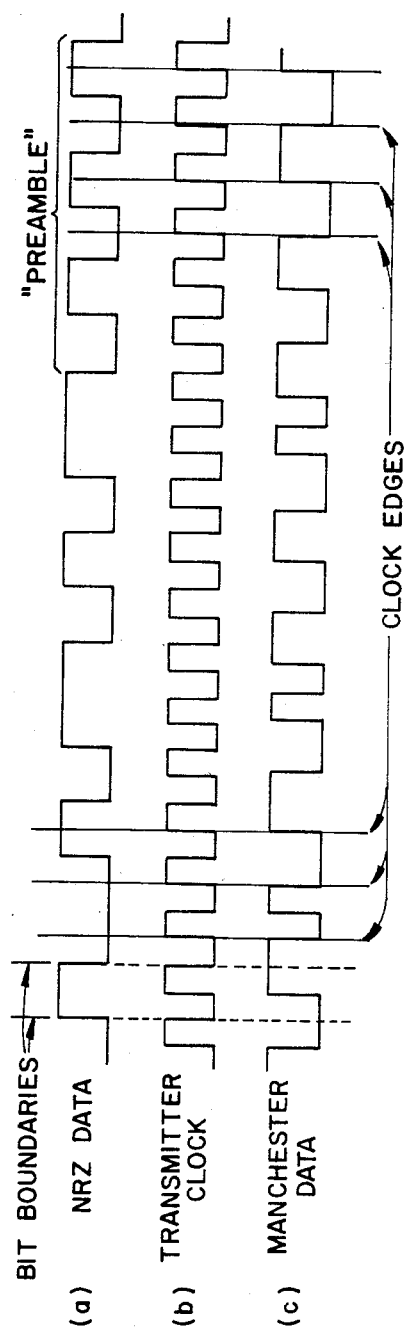
FIG._1.
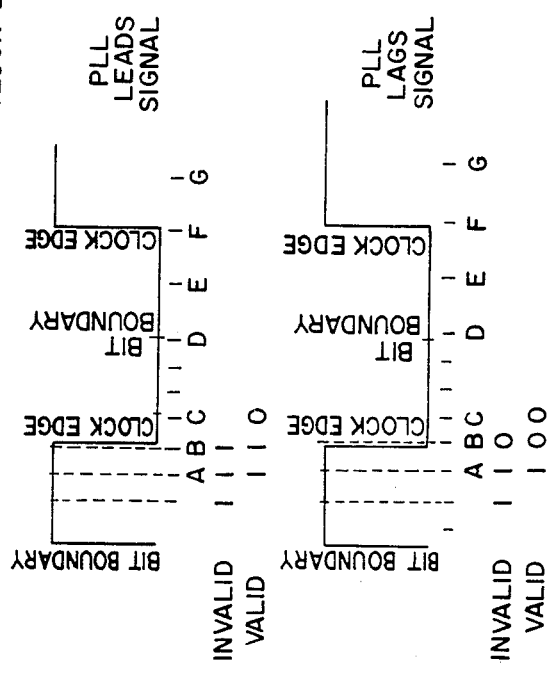
FIG._2.

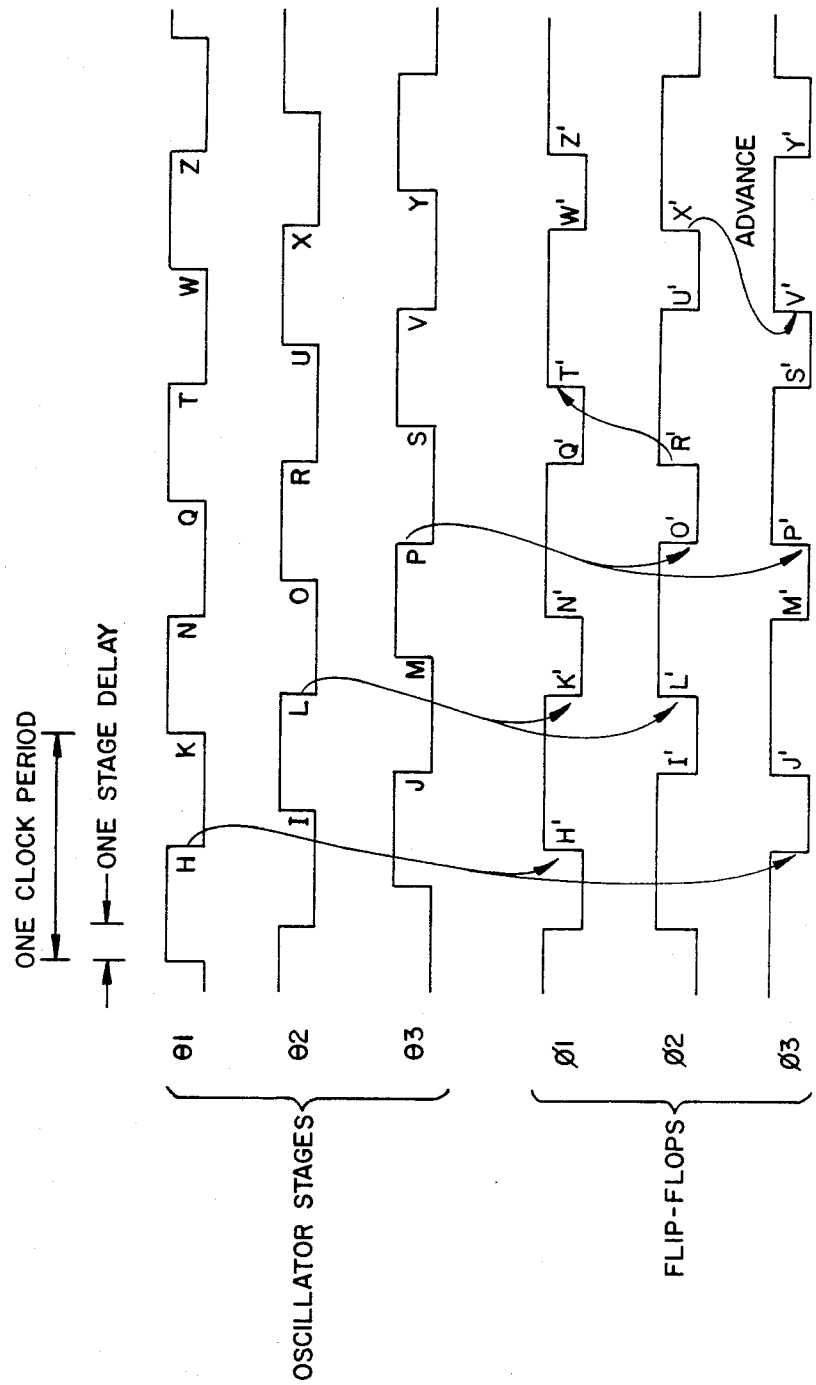
FIG._3.

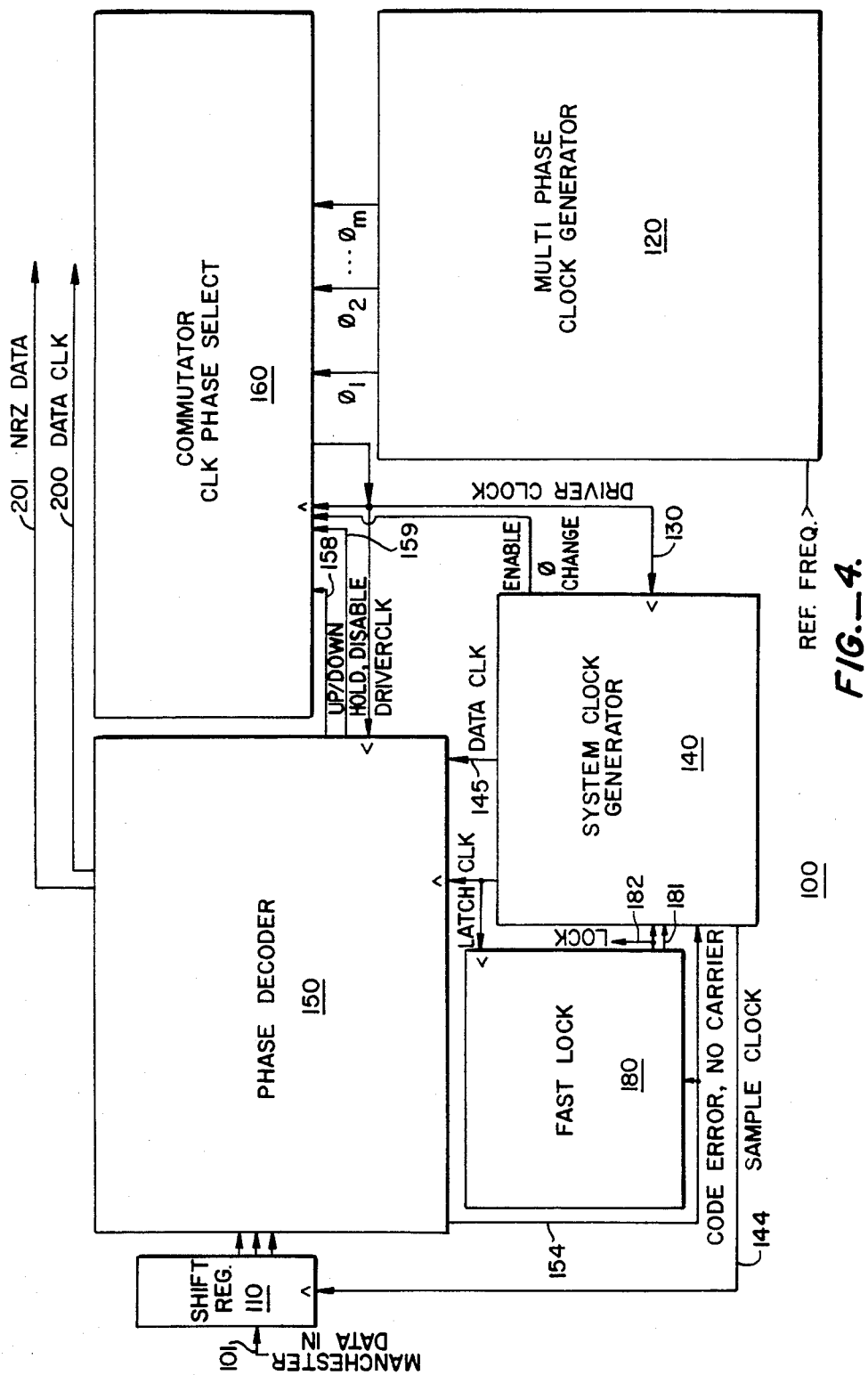
FIG._4.

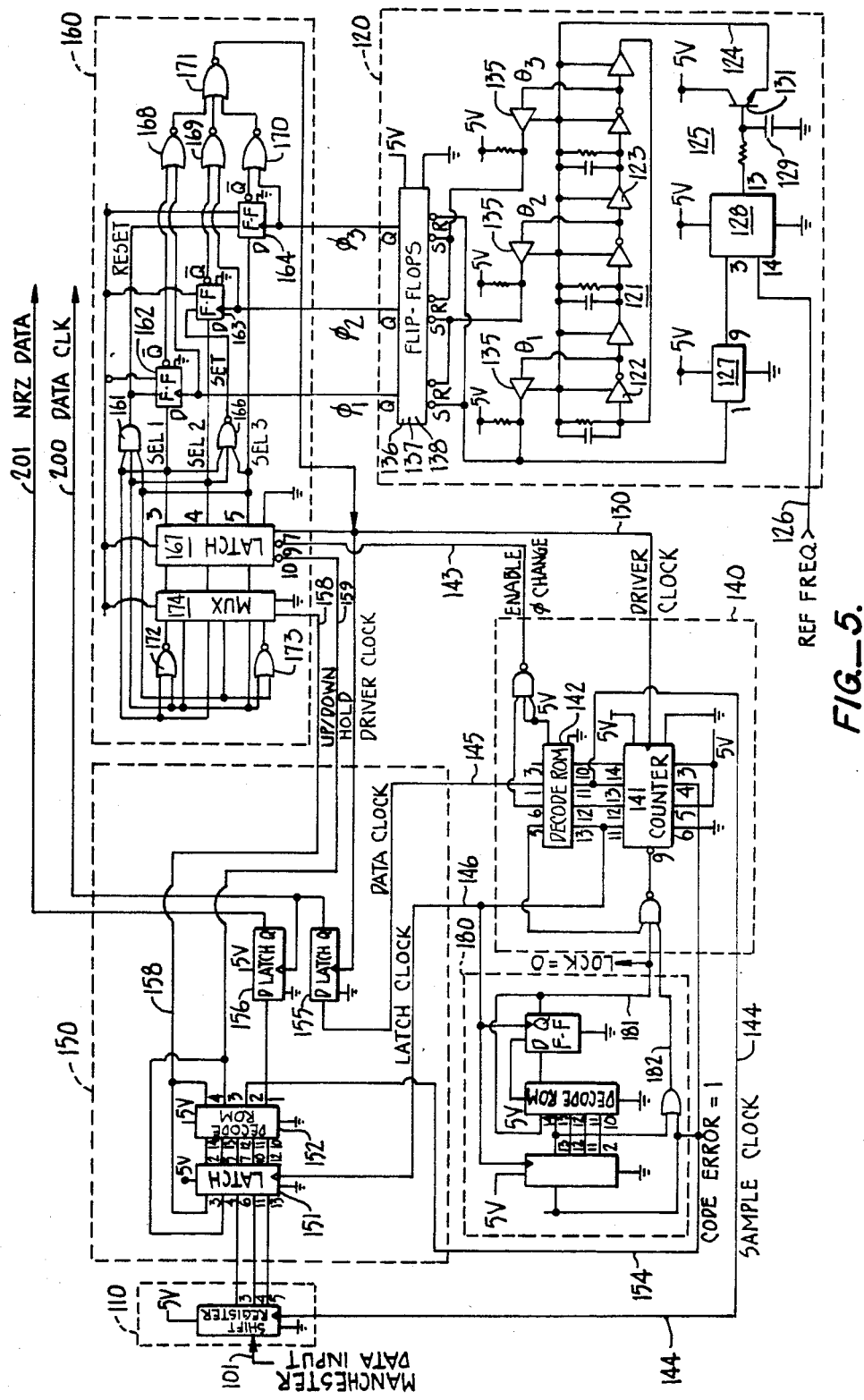
FIG._5.

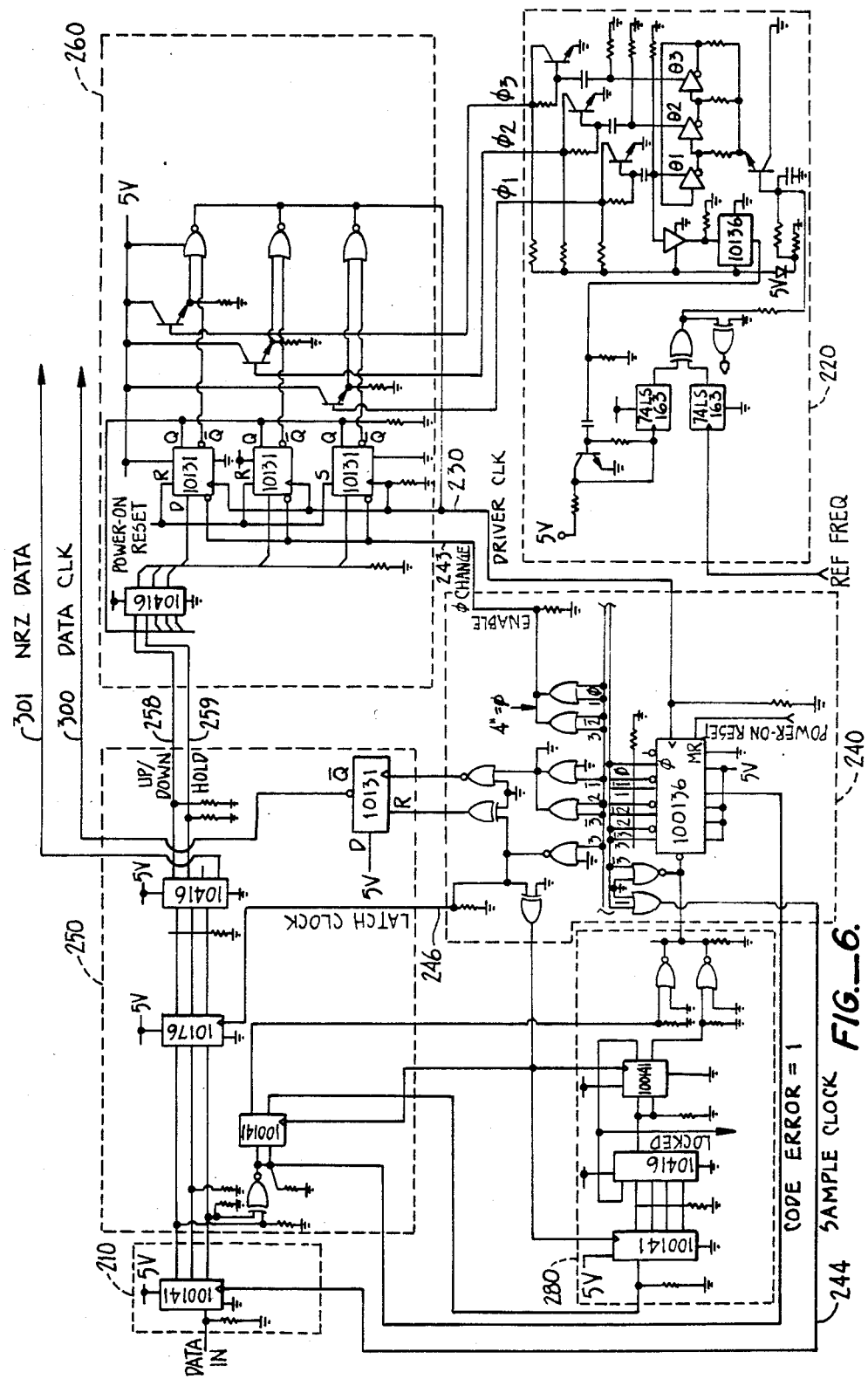
FIG._6.

DIGITAL PLL DECODER

BACKGROUND OF THE INVENTION

1. Technical Field

The present invention relates to receiving and decoding serial digital data, and particularly to a high resolution, high speed, digital phase lock loop circuit that decodes Manchester encoded data into NRZ data and a clock signal.

2. Description of the Prior Art

Many kinds of information can be encoded and represented by binary numbers. A binary number has a predetermined length or number of digits, for example eight, and each digit has one of two possible values. A binary number may be expressed electronically by using high and low voltage signals known as no return to zero ("NRZ") bit signals, as shown, for example, in FIG. 1(a). These signals may be communicated from a transmitter to a receiver. It is commonly desirable to perform such communications through a single wire or equivalent path. This is done by transmitting the bits of one binary number (byte) serially, followed by the bits of the next byte, and so on.

For successful error free communication, the receiver must be able to distinguish individual bits. For example, two successive low voltage signals must not be mistaken for a single low signal. In general, serial transmitters use a precision clock to transmit data bits at a specified rate, and the receiver uses a matched clock to predict where to look for the boundaries of received data bits. As the transmission proceeds, however, the receiver clock will inevitably "drift" relative to the timing of the transmitter clock, impairing the receiver's tolerance of phase jitter and noise in the received signal.

One prior art solution to the problem of drift is to provide the transmitter clock signals to the receiver so that the two clocks may be resynchronized. One conventional technique for doing this is known as "Manchester" encoding of the data bits. According to that technique, the transmitter uses an exclusive OR (XOR) gate to combine the NRZ data bit signals to be communicated (FIG. 1a) with transmitter clock signals (FIG. 1b) which oscillate at twice the data bit transmission frequency. This produces a Manchester encoded data bit stream (FIG. 1c) in which the first half of each bit is the inverse value of the original NRZ data bit value, and the last half is the same value as the NRZ data bit. Any steps at boundaries of the original NRZ data bits are eliminated. However, more importantly, halfway between the boundaries of every Manchester data bit there is a step corresponding to a transmitter clock signal. A "preamble" of alternating NRZ 1's and 0's which are Manchester encoded without steps at bit boundaries, (FIG. 1c) is transmitted to enable the receiver to synchronize with and lock onto the transmitter clock signal. The receiver is thus able to distinguish individually received data bits, and to synchronize its internal processes to those of the transmitter without the need for a separately transmitted clock signal.

The receiver decodes the Manchester data to recover NRZ data by sampling each received data bit at several points. The receiver clock must be matched within 25% of the transmitter clock to sample for the transmitter clock within ¼ bit of the transmitted clock edges, or samples will be taken on the wrong side of the mid-bit steps or outside the bit boundaries. With a 10 MHz clock signal, as typically used on Ethernet ® local area networks, bits are each 100 nanoseconds (nsec) in duration, so the combined transmitter and receiver tolerance must be ±25 nsec (25% of 100 nsec) to assure accurate decoding. Because bit boundary deviations of 22 nsec are not unusual, the receiver must predict the transmitter clock to within ±3 nsec, and preferably to within ±2 nsec.

A conventional Phase Lock Loop (PLL) receiver circuit maintains its synchronization by comparing and adjusting its clock to received clock edges. High speed PLL receivers usually use analog circuitry. In an analog PLL, the received and receiver clock signals are supplied to a comparator which produces a constant voltage output pulse for the duration of the phase difference of the clock signals. The output pulse is integrated to produce a voltage, which is applied to a voltage controlled oscillator (VCO), to produce a phaselocked receiver clock signal. Analog PLL's have the potential for infinite resolution, but require external precision resistors and capacitors. Furthermore, analog circuits are susceptible to signal noise, which limits their resolution in practical implementations.

Digital PLL circuits do not require external precision components. However, the resolution of a digital PLL circuit is limited to its "effective" sampling interval, the minimum interval at which samples may be taken. In a PLL circuit a high speed clock signal increments a counter to a preselected number, and the counter supplies a sample clock pulse to a comparator for comparison with the received clock signals. Conventionally, if the sample clock signals lead, a pulse is dropped from the pulse stream supplied to a counter input terminal, to delay the count. If the sample clock signals lag, an extra pulse is inserted into the counter input stream.

This method of operation is undesirable because of the speed with which pulses must be added or subtracted. For example, for a digital PLL to operate by the conventional method within a 2 nsec margin of error desirable for receiving data at 10 MHz, samples would have to be taken at least once per 2 nsec, or at a 500 MHz rate. To insert an extra pulse into the counter input stream, the driver clock would have to operate at twice the sampling rate, 1 GHz, which is a 1 nsec pulse period. The pulses must be less than half of the period, say 0.4 nsec, with rise and fall times of 0.05 nsec each. Because the fastest satisfactory clock signal that can be generated by present technology is about 250 MHz, digital PLL decoding of a 10 MHz signal by conventional techniques cannot be achieved with the needed resolution. There is, therefore, a need for a digital PLL technique to provide an effective sampling interval shorter tha the driver clock period.

SUMMARY OF THE INVENTION

The present invention uses a driver clock generator which supplies a series of clock signals of different phases, and a clock signal phase selector to attain an effective phase lock resolution equal to the time difference between different phase clock signals from the driver clock. The driver clock has multiple stages, and the time difference between adjacent phases is the driver clock period divided by the number of stages. A selected phase of the driver clock signal increments a counter in a system clock generator to produce a sample clock signal at four times the received bit rate, and to produce a data clock signal at the bit rate.

The sample clock causes a shift register to sample received signals at the bit quarter points when the circuit is locked. The sample pattern indicates whether the sample clock needs to catch up or to drop back. If the sample taken at the mid-bit clock edge matches the first quarter sample, the driver clock signal is leading and needs to be retarded by being switched to a lagging phase signal from the driver clock generator. Conversely, if the mid-bit sample matches the third quarter sample, the driver clock signal is lagging and needs to be advanced to a leading phase. A phase selector or commutator makes corrections to the driver clock timing by selecting a leading or lagging output signal of the multi-phase clock generator to replace the phase currently used as the driver clock signal. The phase locked data clock signals are used to reclock the received data bits, which are provided as an output signal. The data clock signals are also provided as a separate output signal.

BRIEF DESCRIPTION OF THE DRAWINGS

FIG. 1 shows how NRZ data bits may be combined with a transmitter clock to form a Manchester encoded data stream;

FIG. 2 is a diagram showing how Manchester encoded data bits are sampled by the invention when the sample clock leads of lags the data bit;

FIG. 3 shows how the driver clock oscillator stage output signals are reshaped by flip-flops and how any given driver clock phase signal is preceded and followed at the effective phase lock interval by the phases of the other driver clock signals;

FIG. 4 is a block diagram of a decoder according to the present invention;

FIG. 5. is a schematic of TTL implementation of the decoder of FIG. 4; and

FIG. 6 is a schematic of a an ECL implementation of the decoder.

DETAILED DESCRIPTION OF THE INVENTION

Referring to FIG. 4, the digital phase lock loop circuit of the present invention 100 receives Manchester encoded serial data at input terminal 101 and provides a phase locked data clock signal and a decoded NRZ data stream at output terminals 200 and 201, respectively.

A driver clock generator 120 generates a high speed driver clock signal from which N clock signals having a predetermined (equally spaced) phase relationship, are provided as $\phi 1, \phi 2, \phi 3 (, \ldots, \phi N)$ at N respective output terminals. These clock signals are shown in FIG. 3. At a given time, a selected one of the different phase clock signals is used as the driver clock signal on line 130, which is applied to system clock generator 140. Generator 140 produces a sample clock signal 144 at four times the received data bit rate and a data clock signal 145 at the data bit rate. Sample clock signal 144 clocks data bit samples into shift register 110. The first (boundary) sample of each bit is not used. The samples at the one-quarter, one-half, and three-quarters points of the data bit are then clocked by data clock 145 into a phase decoder 150. In a pattern of data bit samples taken across an edge, termed a "valid" pattern herein, the first and third samples have opposite values. See FIG. 2. The middle sample agrees with the sample on the side of the clock edge on which it was taken, thereby indicating whether the timing of sample clock 144 needs to be advanced or retarded. Accordingly, phase decoder 150 applies an UP/DOWN signal to line 158 to commutator 160, which switches driver clock signal line 130 from the present clock phase $\phi$ to the present leading or lagging phase, as appropriate.

The commutator should not, while the circuit is essentially synchronized, jump back and forth between driver clock phases on successive bits in an attempt to lock more precisely than the lock resolution. Similarly, the commutator should not try to track individual bits in a jittery (quavering) data clock signal. To damp such activity, phase decoder 150 also applies a HOLD signal to line 159 when it has applied an UP/DOWN signal calling for an opposite correction on the preceding bit.

Because normal phase corrections are only as large as the intentionally fine lock resolution, making a large adjustment would take numerous bits. To converge initially on the received data clock, the invention preferably employs a fast lock circuit 180 rather than making repetitious slight corrections. Whenever phase decoder 150 does not recognize a valid sample pattern, with opposite value first and third bits, it applies a "no carrier" or "invalid code" signal to line 154, causing the frequency of the system clock generator 140 to increase, to preferably double, the sample clock 144 frequency, thereby halving the sample interval. While the circuit is in locked mode, and a carrier is detected, clock generator 140 will produce sample clock 144 pulses at four times the data bit rate. A "no carrier" signal on line 154, however, will cause fast lock circuit 180 to apply a high signal to line 181, putting system clock generator 140 in fast lock mode, when the generator produces sample clock and latch pulses eight times per bit. Referring to FIG. 2, the first valid code (A, B, C) will be recognized when sample C is taken, presumably within one-eighth of a bit after the mid-bit clock edge, and fast lock circuit 180 applies low signals to lines 181 and 182, forcing system clock generator 140 to that point. When bit boundary "D" passes, system clock generator 140 will sample at its normal four-times-per-bit rate.

Although phase lock resolution depends upon the driver clock stage delay, multiple phase difference corrections could be made by sampling each bit more often, say six or eight times, to obtain sample patterns indicating not just the direction but also the magnitude of clock deviations. Although an inverting ring oscillator will usually have an odd number of stages in the loop, an extra even numbered stage could be added outside the loop, and if all stages were part of one integrated circuit, their delays would be substantially identical. More sophisticated logic in commutator 160 and sufficient oscillator stages in generator 120 could switch an arbitrary number of stage delays ahead or behind. This would offset the need for fast lock circuit 180.

The invention may be implemented using TTL components as shown in FIG. 5. Pin numbers are shown for the suggested components. Driver clock generator 120 comprises a multi-stage inverting oscillator 121 using inverters 122 such as type 74C14 and amplifiers 123 such as type 74C906. The oscillator period is a function of the control voltage on line 124, which is regulated by an analog phase lock loop 125. The analog PLL needs only to lock to a reference frequency 126 from a stable crystal oscillator (not shown), and is not a critical design. The filter components can vary significantly without affecting performance of the invention. Any one of the oscillator output phases, for example $\theta 1$, is fed back to analog PLL 125 and divided by 127 such as a type CD4024. The counter 127 output is compared by comparator 128, which may be a type CD4046, to reference frequency 126. Comparator 128 produces a pulse of a width in proportion to the phase difference. The width of the pulse charges capacitor 129, and maintains a voltage on the base of preferably a type P04 transistor 131. Current through the transistor regulates the control voltage 124 supplied to the oscillator 121 stages.

Referring also to FIG. 3, a $\theta 1$ down step "H" from inverter 122 will cause, after one (inverter+amplifier) stage delay, a $\theta 2$ up step "I", then after the next delay, a $\theta 3$ down step "J," and after another delay a $\theta 1$ up step "K." Thus, the period of $\theta 1$ (as well as of $\theta 2$ and $\theta 3$) is six stage delays. In the oscillator 121 or at the output terminals of flip flop 136, 137, 138, any step, say R', is paralleled by a step T' one-third of a period later in another phase, and a step P' one-third of a period earlier in the remaining phase.

Pulse trains $\theta 1$, $\theta 2$, and $\theta 3$ are buffered by amplifiers 135, preferably type 74C906. The pulse trains are reshaped by Set-Reset flip flops 136, 137, and 138 for which a type CD4044 may be used. Falling edges from each oscillator stage output line $\theta$ set a flip flop, and four stages later, reset the same flip flop to produce the $\theta$ waveforms as shown in FIG. 3. Thus, the $\theta$ signals have a period 4 stage delays high and 2 stage delays low.

When power is initially supplied to circuit 100, commutator 160 arbitrarily selects $\phi 2$ by default. If all three select lines SEL-1, SEL-2, and SEL-3 are high, AND gate 161 resets flip flops 162 and 164, allowing $\phi 2$ to set flip flop 163 high, and its $\overline{Q}$ output terminal 165 low. If all three select lines are low, NOR gate 166 sets flip flop 163. The commutator flip flops may be type CD4013.

Until phase decoder 150 detects a valid sample pattern, it applies a high signal to line 154, causing fast lock circuit 180 to apply a high signal to line 181, and loading counter 141 to a value of seven. On the next driver clock 130 pulse, when counter 141 increments to eight, every counter output pin changes value, and one of these applied to the latch clock 146 line and cycled through fast lock circuit 180 will reset, on the next driver clock 130 pulse, counter 141 to seven again, producing latch clock 146 pulses at eight times the normal rate.

When the circuit is locked onto the received data clock using $\phi 2$, latch 167 output line SEL-2 is high and lines SEL-1 and SEL-3 are low. Latch 167 is preferably a type 74C173. Each select line is applied to the "D" input, and the corresponding driver clock phase output $\phi$ is applied to the clock input, of a respective flip flop 162, 163, or 164. The non-selected flip flops 162 and 164 apply a high $\overline{Q}$ signal to respective NOR gates 168 and 170, holding the NOR gate outputs low and blocking the $\phi 1$ and $\phi 3$ signals. Selected flip flop 163 applies a low $\overline{Q}$ to line 165 to NOR gate 169, allowing the $\phi 2$ signal to pass gate 169 inverted, and NOR gate 171 reinverted. The output of NOR gate 171 is the system driver clock on line 130 which drives the commutator itself, and the system clock generator 140, and consequently the input shift register 110 and phase decoder 150.

In response to phase decoder UP/DOWN signals on line 158, commutator 160 switches; among phases to advance or retard the driver clock pulses being counted by system clock generator 140. A data bit sample pattern of (0, 1, 1) or (1, 0, 0) (see FIG. 2), in type 74C174 latch 151 makes type 74S288 decoder ROM 152 output UP/DOWN line 158 low, indicating that the sample clock 144 should be advanced. Commutator logic in gates 172, 173 and MUX 174, or in a ROM, determines that for the present phase $\phi 2$, the leading phase is $\phi 3$. MUX 174 holds pin 9 high, and pin 7 low. These are input to latch 167. Within the half data bit between taking the third quarter sample of one data bit and taking the first quarter sample of the succeeding data bit, ROM decoder 142 applies a signal to "enable $\phi$ change" line 143 to enable latch 167 for a phase switch. On the next driver clock 130 edge, say, L', SEL-2 goes low and SEL-3 goes high. The next rising edge in $\phi 3$ is P', which is applied to flip flop 164, producing a low $\overline{Q}$ to NOR gate 170 and passing the $\phi 3$ clock to commutator output NOR gate 171. Likewise, with SEL-2 line now low, the next $\phi 2$ rising edge R' is applied to flip-flop 163 to produce a high $\overline{Q}$ signal which will block $\phi 2$ from passing NOR gate 169. Driver clock 130 has now been switched to a leading phase. The first change to appear in the driver clock signal is falling edge S'. The new rising edge V' counted by counter 141 will be one-third of a period sooner than the edge it replaces, X'.

The sequence for switching to a lagging phase is similar. Going from phase $\phi 2$ to $\phi 1$, SEL-2 goes low and SEL-1 goes high at, say, L'. The flip-flop 162 $\overline{Q}$ output is clocked low by edge N', allowing $\phi 1$ to pass NOR gate 168. $\phi 2$ clocks the flip flop 163 $\overline{Q}$ output high on edge R', and $\phi 1$ edge Q' causes a low output from NOR gate 171 rather than former edge R'. The new rising edge T' is one stage delay later.

Driver clock pulses are counted by counter 141, preferably a type 74C163, which applies a rising edge to sample clock line 144 when the second least significant bit of the counter is set to one on every fourth driver clock pulse. Counter 141 applies a decoder latch-clock rising edge to line 146 when the fourth least significant bit is set to one on every sixteenth driver clock pulse. Counter 141 also applies signals to retiming ROM 142, preferably type 74S288, which produces the "enable $\phi$ change" signal 143, and, offset from that, a data retiming pulse 145 for re-timing latch 155. Latch 155 uses driver clock 130 to clock the data clock 145 pulse out. The data clock pulse is output on line 200 and is used to clock the three-quarter bit sample into data latch 156, preferably type CD4013, and onto NRZ data output line 201.

The invention as implemented using the TTL components described above and using a 2 KHz reference frequency will have a driver clock frequency in the range of 16 KHz and will decode Manchester data received at 1 KHz. Those skilled in the art may implement the inventive concept in ECL components as shown in FIG. 6, or in a single integrated circuit, to decode Manchester data at 10 MHz. The reference numbers in FIG. 6 denote elements corresponding to equivalent elements labeled by numbers 100 less in FIG. 5. With a 160 MHz driver clock, the driver clock phases $\phi$ are 2 nsec apart, and phase lock resolution is 2 nsec. This eliminates the need for a 1 GHz clock that would be required in a prior art circuit of comparable resolution. Furthermore, the shortest pulses in 10 MHz embodiments are 2 nsec, avoiding the present impossibility of producing pulses onefifth that long which would be required by the prior art technique.

Details have been disclosed to illustrate the invention in a preferred embodiment of which adaptations and modifications within the spirit and scope of the invention will occur to those skilled in the art. For example, the invention could be adapted to lock onto an NRZ data transmission by sampling for clock edges in start/stop bits while skipping data bits. The scope of the invention is limited only by the following claims.

What is claimed is:

1. A digital phase lock loop circuit comprising:
   a serial data input line for supplying received data signals;
   a driver clock generator having multiple output terminals at which the generator provides clock signals having a predetermined phase relationship to each other;
   a driver clock line alternately connectable to any one of the terminals;
   input sampling means responsive to signals on said driver clock line to take samples of data bit signals received on said data input line, to detect sample the patterns; and
   commutator means connected by a respective line to each of the clock generator terminals, and responsive to an UP/DOWN signal to connect the driver clock line to a determined one of the terminals.

2. A circuit as in claim 1 wherein said driver clock generator has N terminals and, at respective terminals, provides clock signals of the same frequency and phase-offset from each other by 360°/N.

3. A circuit as in claim 2 and wherein said clock generator comprises an inverting ring oscillator having at least three inverting stages, and each stage has a stage output terminal connected to a respective generator output terminal.

4. A circuit as in claim 3 and further comprising:
   a reference frequency source; and
   an analog phase lock loop circuit including
   a counter having an input terminal connected to one of the oscillator stages, and a counter output terminal producing a signal at a predetermined count of input signals;
   a comparator having a first input terminal connected to the counter output terminal, a second input terminal connected to said reference frequency source, and a comparator output terminal producing a constant voltage pulse of a duration in proportion to the time difference between the phases of the comparator input signals;
   a capacitor connected to store the charge produced at said comparator output terminal; and
   a bipolar transistor having its collector connected to a voltage source, its emitter connected to supply power to the oscillator stages, and its base connected to the comparator output terminal so that charge stored in the capacitor regulates current flowing through the emitter, thereby regulating the signal propagation delay of the oscillator stages.

5. A circuit as in claim 3 and further comprising N flip flops, each having a Set input terminal connected to a respective oscillator stage output terminal, and a Reset input terminal connected to the succeeding oscillator stage output terminal, and having a Q output terminal connected to a clock generator output terminal.

6. A circuit as in claim 2, wherein said input sampling means is responsive to signals on said driver clock line by sampling three times for each transmitter clock signal edge received on said data input line, said input sampling means is responsive to the pattern of the samples by producing the DOWN signal if the first and second samples agree or the UP signal if the second and third samples agree, and wherein said commutator means, in response to a DOWN signal, connects the driver clock line to the generator clock terminal for the clock phase lagging the previously connected clock, or in response to an UP signal connects the driver clock line to the generator clock terminal for the clock phase lagging the previously connected clock.

7. A circuit as in claim 6 wherein said input sampling means also has a HOLD output signal line to which a HOLD signal is applied if the current value on the UP/DOWN line is opposite the UP/DOWN value produced for the immediately preceding pattern of samples.

8. A circuit as in claim 6 and further comprising a system clock generator including a counter having an increment input terminal connected to the driver clock line, and having output terminals at which said counter produces sample clock and latch clock signals at selected multiples of driver clock signals, and wherein said input sampling means takes one sample in response to each sample clock signal and outputs an UP or DOWN signal in response to each latch clock signal.

9. A circuit as in claim 8 further comprising a retiming ROM for modifying the outputs of said counter, and for producing a data clock signal.

10. A circuit as in claim 8 wherein said input sampling means also has a code error output terminal to which it applies an error signal when first and third samples in a pattern are alike, and wherein said counter has a reset input terminal, and further including a fast lock circuit comprising:
    a code error input terminal connected to input sampling code error output terminal;
    a clock input terminal connected to said latch clock; and
    a lock indicator output terminal connected to the counter reset terminal;
    said fast lock circuit being responsive to error and latch clock signals to produce, upon a predetermined count of latch clock input signals, a lock/unlock indicator signal at said lock indicator output terminal.

11. A curcuit as in claim 10 wherein, responsive to an unlock indicator signal, said system clock generator counter increases the sample colck to twice, and the latch clock to eight times, their frequencies in response to a lock indicator signal.

12. A phase lock loop method for detecting clock signal bit edges, comprising the steps of:
    providing a multiple phase driver clock generator producing, at respective terminals, N clock signals phase-offset from each other by 360°/N;
    providing a driver clock line connectable to any one of the N terminals, and commutator means responsive to a received signal sample pattern to connect the driver clock line to one of the N terminals instead of another of the N terminals;
    sampling three times for a received clock signal edge in response to driver clock signals;
    applying a signal indicating the sample pattern to the commutator; and
    using the commutator to connect the driver clock line to a terminal for a lagging phase clock signal if the first and second samples in the pattern agree, or to a terminal for a leading phase clock signal if the second and third samples agree.

13. The method of claim 12 and including the further step of increasing the ratio of sampling frequency to driver clock signal frequency when first and third samples in a pattern agree.

14. The method of claim 13 and including the further step of blocking the commutator from switching the driver clock to a leading or lagging phase clock signal from the clock generator if a switch was made to the lagging or leading phase clock signal, respectively, for the immediately preceding pattern of three samples.

* * * * *